United States Patent [19]
Glenn et al.

[11] Patent Number: 6,034,429
[45] Date of Patent: Mar. 7, 2000

[54] INTEGRATED CIRCUIT PACKAGE

[75] Inventors: Thomas P. Glenn, Gilbert, Ariz.; Roy D. Hollaway, Paranaque, Philippines; Anthony E. Panczak, Sunnyvale, Calif.

[73] Assignee: Amkor Technology, Inc., Chandler, Ariz.

[21] Appl. No.: 08/844,536

[22] Filed: Apr. 18, 1997

[51] Int. Cl.[7] .................................................. H01L 23/053
[52] U.S. Cl. .......................................... 257/701; 257/704
[58] Field of Search .................................. 257/704, 710, 257/701, 702

[56] References Cited

U.S. PATENT DOCUMENTS

| | | | |
|---|---|---|---|
| 4,530,152 | 7/1985 | Roche et al. | 29/588 |
| 4,890,383 | 1/1990 | Lumbard et al. | 437/226 |
| 5,043,004 | 8/1991 | Miyauchi | 65/32.2 |
| 5,102,829 | 4/1992 | Cohn | 437/217 |
| 5,126,818 | 6/1992 | Takami et al. | 357/68 |
| 5,192,681 | 3/1993 | Chiu | 437/217 |
| 5,230,759 | 7/1993 | Hiraiwa | 257/704 |
| 5,241,133 | 8/1993 | Mullen, III et al. | 174/52.4 |
| 5,250,470 | 10/1993 | Yamaguchi | 437/211 |
| 5,278,429 | 1/1994 | Takenaka et al. | 257/678 |
| 5,336,931 | 8/1994 | Juskey et al. | 257/787 |
| 5,414,300 | 5/1995 | Tozawa et al. | 257/704 |
| 5,436,203 | 7/1995 | Lin | 437/209 |
| 5,474,957 | 12/1995 | Urushima | 437/209 |
| 5,578,525 | 11/1996 | Mizukoshi | 437/206 |
| 5,593,926 | 1/1997 | Fujihara | 437/209 |
| 5,742,007 | 4/1998 | Kornoski et al. | 257/704 |

FOREIGN PATENT DOCUMENTS 62-9639   1/1987   Japan.

OTHER PUBLICATIONS

Banerji, K., "Development of the Slightly Larger Than IC Carrier (SLICC)", Proceedings of the Feb. 27–Mar. 4, 1994, Technical Program NEPCON WEST '94, pp. 1249–1256.

Levine, B. and Guinther, F., "The Package", *Electronic News*, vol. 42, No. 2112 (1996), pp. 1, 32.

Patent Abstracts of Japan, vol. 096, No. 012, Dec. 26, 1996, & JP 08 213498 A (Sumitomo Kinzoku Electro Device:KK), Aug. 20, 1996.

Patent Abstracts of Japan, vol. 011, No. 304 (E–545), Oct. 3, 1987, & JP 62 097355 A (Toshiba Corp), May 6, 1987.

*Primary Examiner*—Carl Whitehead, Jr.
*Assistant Examiner*—Roy Potter
*Attorney, Agent, or Firm*—Skjerven, Morrill, MacPherson, Franklin & Friel LLP; Alan H. MacPherson; James E. Parsons

[57] ABSTRACT

A package for an integrated circuit is described, as is a method of making the package. The package is comprised of a substrate having a substantially planar first surface on which an integrated circuit die is placed. An imperforate adhesive bead on the first surface of the substrate surrounds the die. A lid transparent to electromagnetic radiation such as ultraviolet light is spaced above the integrated circuit, in a press-fitted interconnection with the bead. Epoxy is a preferred material for the bead. The lid is a single-piece of flat material, such as plastic, ceramic, or glass, which can have a diagonal edge.

75 Claims, 3 Drawing Sheets

INTEGRATED CIRCUIT PACKAGE

FIELD OF THE INVENTION

The present invention relates to integrated circuit packages, and in particular to a low cost, integrated circuit package.

BACKGROUND OF THE INVENTION

A goal in packaging integrated circuits is to reduce the cost and difficulty of manufacturing reliable packages. This goal is particularly present in packaging erasable programmable read-only memory devices ("EPROM"), charge coupled devices ("CCD"), and the like. Each such device requires a transparent package surface above the die, such as a quartz window, which increases manufacturing cost and difficulty.

A conventional package for an EPROM device, for example, has a ceramic base and an opposing ceramic lid. The base and/or lid have central depressions. When the base and lid are opposed, the depression(s) define a cavity for the die. The ceramic portions of the base and lid form the sides of the package. The lid has an aperture into which a glass or quartz window is fitted. A conductive metal lead frame is sandwiched between the base and lid. The leads of the lead frame perforate the sides of the package, extending laterally into and away from the cavity. Inside the cavity, the leads are connected to the die by bond wires. Thin layers of frit seal glass bond the base and lid to the lead frame and thus to each other.

Such packages have cost disadvantages, such as the need for a two-piece lid and a lead frame permeating the sides of the package. These and other cost and manufacturability disadvantages are also present in other EPROM packages, such as those shown in U.S. Pat. Nos. 5,043,004 and 5,192,681.

SUMMARY OF THE INVENTION

The present invention includes a package enclosing one or more integrated circuit die, and a method for making such a package. The package is useful, for example, in SAW, EPROM and CCD applications.

A package in accordance with one embodiment of the invention has an insulating substrate as a base upon which a die is placed; an imperforate adhesive bead surrounding the die as the package sidewalls; and a lid, centered over and spaced above the substrate and die, in press-fitted interconnection with the bead.

The substrate has a substantially planar first surface upon which at least one integrated circuit die is placed, and an opposing second surface. Conductive structures on the substrate, and conductive vias through the substrate, provide electrical connectivity between the die and external circuitry.

The imperforate adhesive bead is applied onto the first surface of the substrate. The bead surrounds the integrated circuit die. The bead is initially viscous, but is hardenable into a solid. Epoxy material or an equivalent such as silicone or a blend of such materials is used for the bead.

The lid is plastic or ceramic for surface acoustical wave ("SAW") package applications. Alternatively, for EPROM or CCD applications, the lid is transparent, at least in part, to a selected electromagnetic radiation, such as ultraviolet, visible, or infrared light. Boro-silicate glass is suitable. The lid has a first surface that faces and is spaced above the first surface of the substrate and the integrated circuit die. A peripheral portion of the first surface of the lid is in a press-fitted interconnection with the bead.

The lid has an edge at its perimeter which is also in press-fitted interconnection with the bead. The lid's edge has perpendicular, or alternatively, a sloped orientation, relative to the first and/or second surfaces of the lid. All or part of the edge portions are in press-fitted interconnection with the bead.

One embodiment of a method of making such a package involves a first step of providing a substrate, such as described above, having a substantially planar first surface and at least one conductive structure on that first surface, and placing at least one integrated circuit die on the first surface of the substrate. The integrated circuit die is electrically connected to one or more of the conductive structures on the first surface of the substrate. A viscous, hardenable, adhesive material, such as epoxy, is applied on the first surface of the substrate to form an imperforate bead around the integrated circuit die(s). The bead extends to a height above the first surface of the substrate which is greater than the height of the integrated circuit die above the substrate.

A lid is also provided. For EPROM or CCD applications, at least part of the lid is transparent to electromagnetic radiation, for example, infra red, ultraviolet, or visible light. For example, a flat, one piece boro-silicate glass lid is used.

The lid is placed onto the bead while the bead is still viscous, so that the first surface of the lid is facing, centered over, and spaced above the first surface of the substrate and the integrated circuit die. A peripheral portion of the first surface of the lid makes contact with the top surface of the bead. The lid is then press-fit into the bead, such as by mechanical pressing. All or part of the edge of the lid is also press fit into the bead, so that the bead material contacts all or part of the edge of the lid. The bead is then hardened, such as by heating the package.

In an alternative method embodiment, a viscous material is applied to the first surface of the substrate to form an imperforate bead substantially around the integrated circuit, leaving at least one discontinuity, e.g., a gap. Additional viscous adhesive material is then applied to the package, after the lid is placed onto and press-fitted into the bead and after the bead partially hardens, to fill any gaps in the bead. The adhesive bead is an epoxy material or equivalent, and the lid is a flat, one-piece boro-silicate glass plate.

An advantage of the packages and methods of the present invention includes a significant reduction in manufacturing cost compared to conventional EPROM, CCD, or similar packages. Another advantage is a reduction in manufacturing difficulties.

DETAILED DESCRIPTION

In the figures, where similar structures are present in more than one figure, the same reference numbers are used for each such structure in each such figure.

Figure 1:
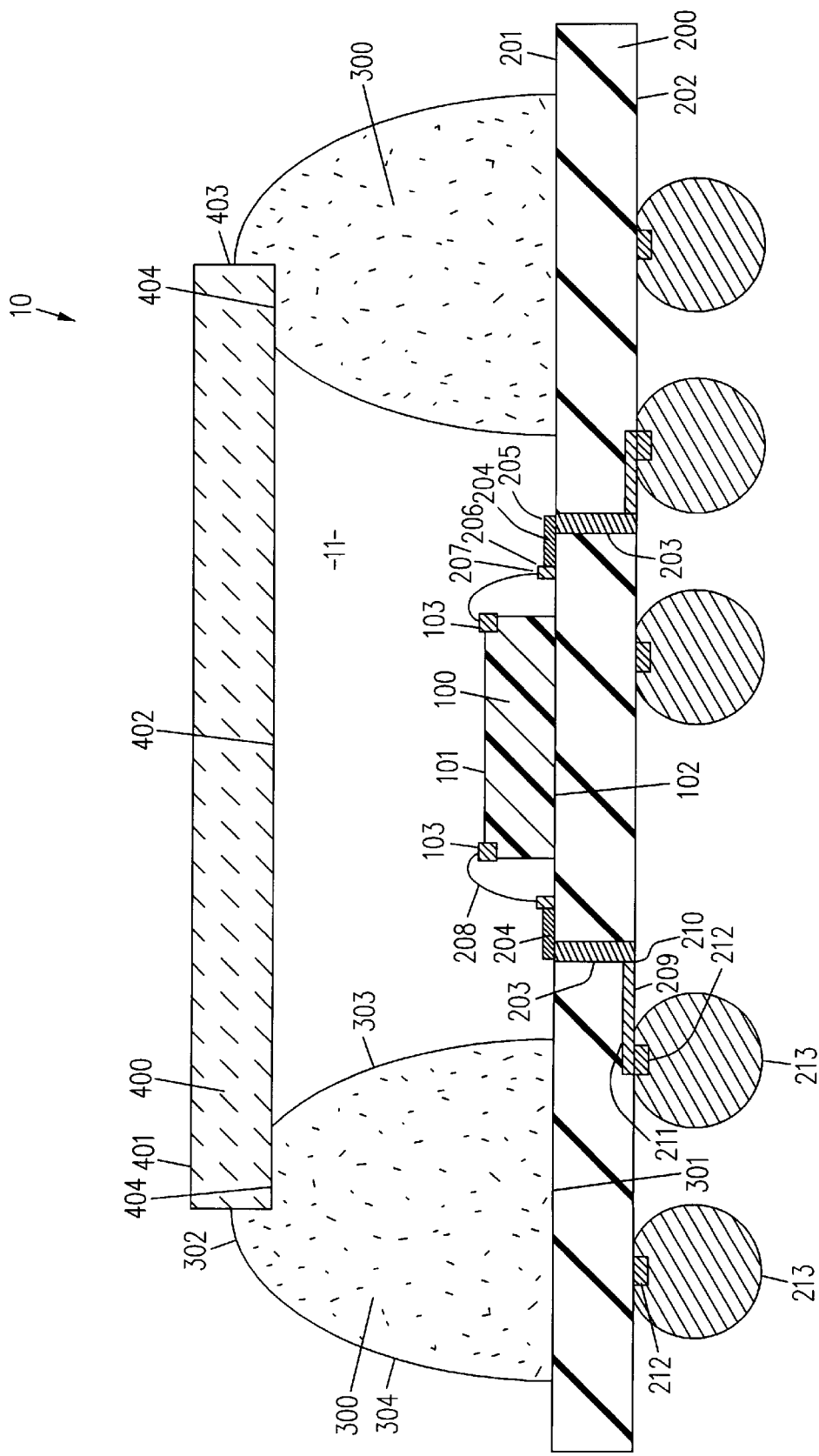
FIG. 1 is a cross sectional view of a package.

FIG. 1 shows a cross section of an embodiment of a package in accordance with the present invention. Within package 10 is a package cavity 11. Within cavity 11 is an integrated circuit die 100. In an alternative embodiment, a plurality of die are contained in one package.

Die 100 has an upper surface 101 and a lower surface 102. Die 100 has a height between upper surface 101 and lower surface 102, a width, and a length. An exemplary size for an integrated circuit die is (0.0:12±0.003)×(0.200 to 0.500)× (0.200 to 0.500) (H,W,L) inches, but the sizes of dies vary.

Die 100 has a plurality of bonding pads 103 on its upper surface 101. These pads are electrically connected to the internal electronic components (not shown) of die 100. Among other things, package 10 provides a protective enclosure or housing for die 100, and conductors for electrically connecting die 100 to external circuitry.

In FIG. 1, die 100 is placed on and attached to substrate 200, which forms a base for package 10. Substrate 200 has an upper surface 201 and a lower surface 202. Both upper surface 201 and lower surface 202 of substrate 200 have an area and a perimeter.

Figure 2A:
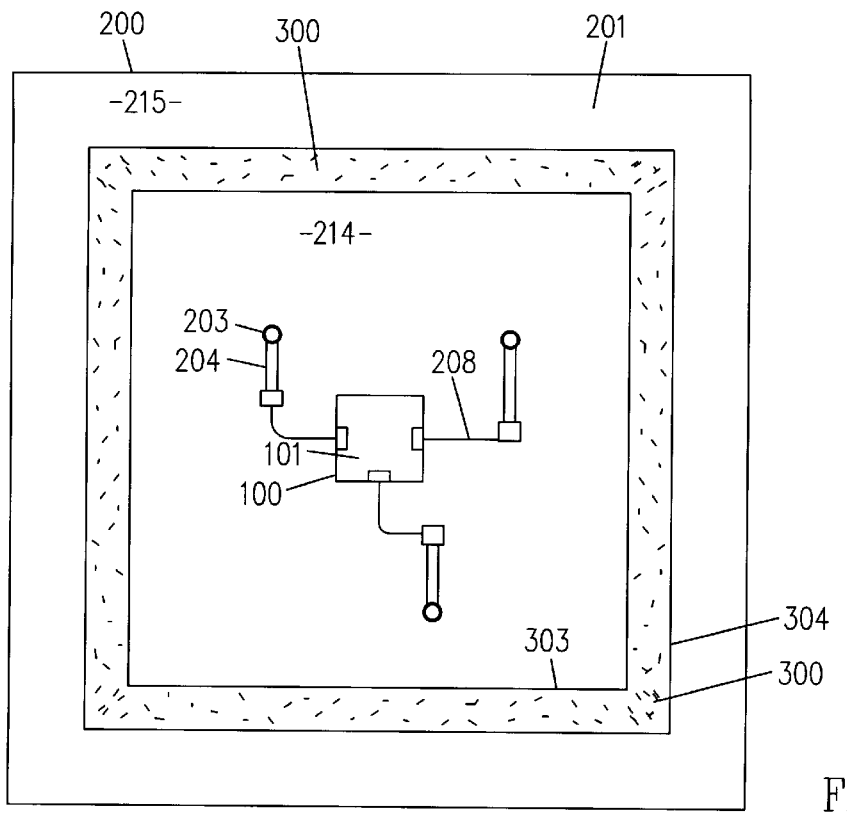
FIGS. 2A and 2B are top views of an incomplete package prior to placing the lid on the bead.

Substrate 200 may have various perimeter shapes, such as a square, rectangle, or circle. In FIG. 2A, for example, substrate 200 is square.

Both upper surface 201 and lower surface 202 of substrate 200 are substantially planar. For example, in the embodiment of FIG. 1, both upper surface 201 and lower surface 202 of substrate 200 are flat.

The size of substrate 200 may vary depending on the application. For example, a larger die typically requires a larger base than a smaller die.

Substrate 200 is comprised of an insulating material, such as a laminate. Alternatively, substrate 200 is of ceramic or insulated metal. Examples of suitable laminate substrates from widely-known vendors include Mitsubishi-BT, Arlon 45N, and Nellco BT.

Die 100 is placed on upper surface 201 of substrate 200 with, for example, a conventional die attach machine, such as the Alpha Sem 9006 from the Alpha-Sem Corporation of Switzerland, or an equivalent. Hand placement may also be used. Die 100 is attached to upper surface 201 with a conventional adhesive epoxy, such as QMI-595 from Quantum Materials, Inc. of San Diego, Calif.

Package 10 includes electrical conductors for electrically connecting die 100 to external circuitry. There are several ways to provide such connectivity. In FIG. 1, for example, substrate 200 includes electrically conductive vias 203 through substrate 200, between upper surface 201 and lower surface 202. For clarity, only two such vias are shown in FIG. 1, but in general a substantial number of such vias are formed, as required. Such vias may be formed, for example, by drilling holes in substrate 200, and plating the drilled holes with metal, such as copper.

In FIG. 1, additional conductors are formed on upper surface 201 and lower surface 202 of substrate 200. For example, one or more electrically conductive metalizations 204 may be formed on upper surface 201. For clarity, only two are shown in FIG. 1, but as many such metalizations may be formed on surface 201, as required. Such metalizations are formable of copper where a laminate substrate is used. Alternatively, if a ceramic substrate is used, such metalizations may be formed of tungsten.

Referring to FIG. 1, each metalization 204 is electrically connected on a first end 205 to a conductive via 203, and on a second end 206 to a conductive contact 207. Contact 207 is, in one embodiment, of layered gold, or alternatively, of nickel and gold.

Contact 207 is electrically connected by a conductive metal bond wire 208 to one of the bonding pads 103 on die 100. As an example, bond wire 208 is formed of gold. Alternatively, instead of using bond wires, die 100 is electrically connected to conductive structures on substrate 200 using tape automated bonding.

Lower surface 202 of substrate 200 also has one or more conductive features for electrically connecting die 100 to external circuitry. In the example of FIG. 1, a plurality of electrically conductive traces or metalizations 209 are shown on lower surface 202 of substrate 200. For clarity, only two such metalizations are shown in FIG. 1, but there may be as many as required. Copper is usable for these metalizations. Metalization 209 is electrically connected on a first end 210 to a via 203, and on a second end 211 to a contact 212, which is similar to contact 207.

The conductive features on lower surface 202 of substrate 200 are arranged in a pattern to match up with and connect to external circuitry (not shown). In FIG. 1, for example, solder balls 213 are formed on contacts 212 on lower surface 202 of substrate 200. This arrangement forms a ball grid array ("BGA") package. In an alternative embodiment, instead of using interconnection balls 213, contacts 212 are the electrical connection points for external circuitry, as in a leadless chip carrier ("LCC"). Alternatively, wire leads together with eutectic solder or metal clips may be used in place of interconnection balls.

Metalizations 204 and 209 may be formed in a conventional manner, for example, by masking and etching copper or other conductive layers formed on substrate 200. Contacts 207 and 212 may be formed using conventional processes such as electroplating or electrodeless chemical plating.

Referring again to FIG. 1, adjacent to and around die 100 on upper surface 201 of substrate 200 is an imperforate bead 300. Bead 300 has a lower portion 301 adhesively contacting upper surface 201 of substrate 200; an upper portion 302 in press-fitted interconnection with a peripheral portion and edge of lid 400; an inner portion 303 facing die 100; and an outer portion 304 facing away from die 100.

Bead 300 is formed of a material that is adhesive. The material of bead 300 should be somewhat viscous and flowable when initially applied to substrate 200 and when lid 400 is placed on and press fitted into bead 300. The material of bead 300 must be hardenable, however, such as by self-curing, heating, or application of ultraviolet light, so that bead 300 may ultimately form a solid package sidewall around die 100. As an example, bead 300 is comprised of an epoxy material, such as Hysol 4451, 4323, or 4328 from the Dexter/Hysol Corp. of City of Industry, Calif. Alternatively, an equivalent material such as silicone from the Dow Corning Company may be utilized for bead 300. As another example, blends of such materials may also be utilized for bead 300.

FIG. 2A is a top view of die 100 on upper surface 201 of substrate 200, before the placement of lid 400 onto bead 300. Bead 300 is shown in the form of a continuous, square, imperforate dam surrounding die 100. An inner portion 214 of upper surface 201 of substrate 200 is shown within bead 300, and an outer portion 215 of upper surface 201 of substrate 200 is shown without bead 300. In an alternative embodiment, outer portion 215 of substrate 200 may be formed (such as by trimming or molding) so that the perimeter of substrate 200 is more flush with outer portion 303 of bead 300.

Figure 2B:
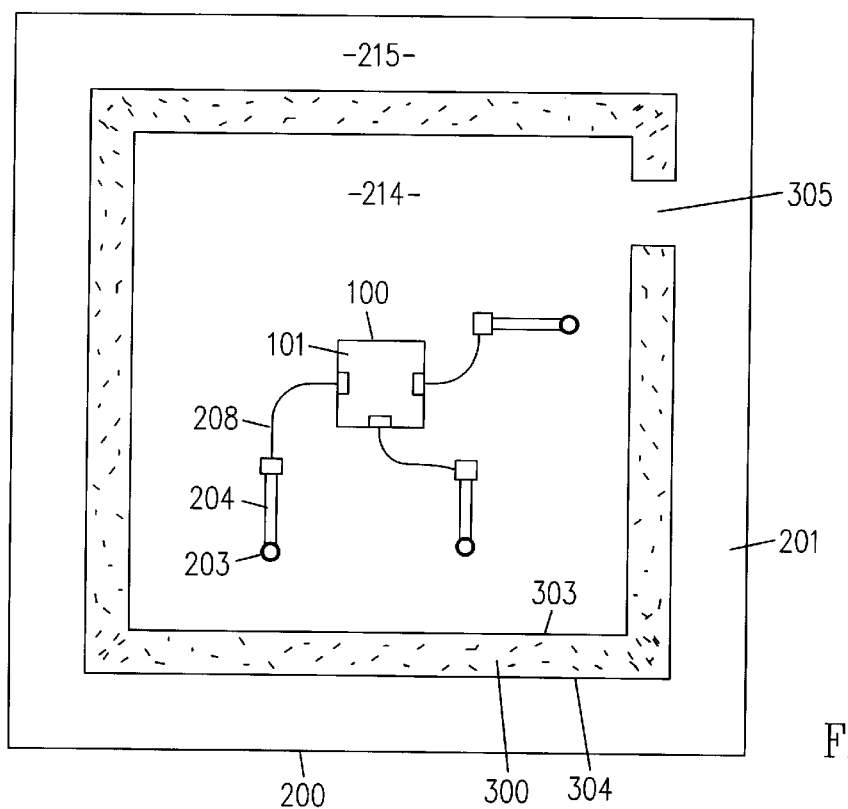

FIG. 2B shows an alternative embodiment where bead 300 is shown in the form of a square, imperforate dam substantially, but not fully, around integrated circuit die 100. Bead 300 has a discontinuity, exemplified by gap 305, which is discussed further below. The term "gap" is used generically. For example, there could be an equivalent clip in the bead. A function of gap 305 is to allow gases to escape the package cavity during hardening. Bead 300 surrounds a majority of the perimeter of die 100.

The path of imperforate bead 300 about die 100 may be varied. For example, instead of a square shape, as shown in FIG. 2A, the path of bead 300 about die 100 may be rectangular or circular. The lateral distance between bead 300 and die 100 may also be varied, depending on the size of die 100 and the desired size of package 10.

An epoxy or equivalent bead may be applied onto upper surface 201 of substrate 200 using a syringe or a conventional epoxy dam writer, such as is available from the Camelot Company or the Asymtek Company.

When an epoxy bead is initially being applied to upper surface 201 of substrate 200, the cross section shape of the epoxy is approximately circular as it comes out of the dam writing machine. An example diameter is approximately 0.030 to 0.045 inches, but the size of the diameter and/or other cross sectional shape of the bead will vary depending on the application. Being viscous and flowable, the epoxy settles into an imperforate domed-shaped dam, as is depicted for bead 300 in FIG. 1.

The height of bead 300 above upper surface 201 of substrate 200, when bead 300 is initially applied to upper surface 201 and before lid 400 is placed onto bead 300, should exceed the height of die 100 and bond wires 208 above upper surface 201 of substrate 200. This may be accomplished, for example, by appropriate selection of the amount of bead material and/or the cross section size of the bead material as it comes out of the syringe or dam writing machine.

Lid 400 forms the top of package 10. In the embodiment of FIG. 1, lid 400 has an upper surface 401, which forms the topmost outer surface of package 10, and a lower surface 402, which is spaced above, centered over, and facing upper surface 401 and die 100. Both upper surface 401 and lower surface 402 of lid 400 have an area and a perimeter. Lid 400 also has an edge 403 at its perimeter, that is, between the perimeter of upper surface 401 and the perimeter of lower surface 402 of lid 400.

The shape and size of lid 400 may be varied depending on the application. Lid 400 is substantially planar. In the embodiment of FIG. 1, upper surface 401 and lower surface 402 of lid 400 are flat. Alternatively, one or both of these lid surfaces may be concave.

The perimeter shape of lid 400 may be, for example, square, rectangular, or circular. The thickness of lid 400 varies, depending on the integrated circuit application and the material selected for lid 400. A typical thickness for lid 400, as exemplified in FIG. 1, is between about 0.02 to 0.04 inches.

Figure 3:
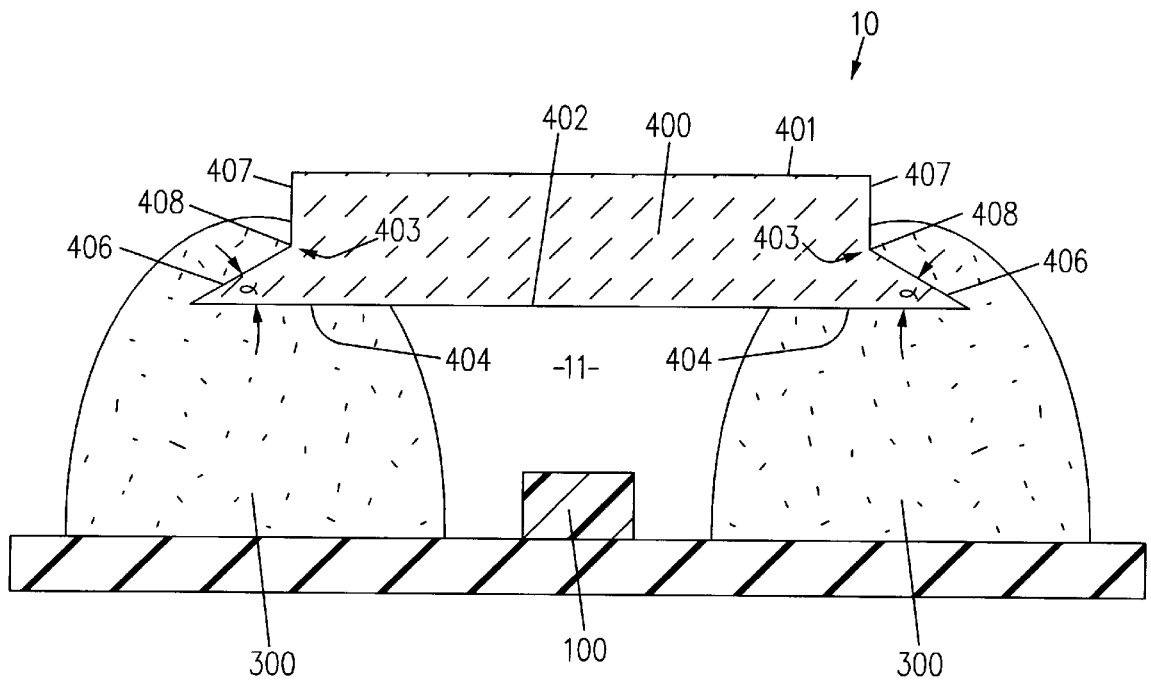
FIG. 3 is a cross sectional view of a lid showing the lid's edge.

The perimeter size of lid 400 may be varied, for example, to reflect the size of the die or dies packaged in package 10. For example, a typical size for a square lid may be 0.300× 0.300 inches. In the embodiments of FIGS. 1 and 3, the lid is sized so that, at the time of placement of lid 400 onto bead 300, the perimeter of the lid coincides with the lateral mid-point of the upper surface of bead 300.

Lid 400 may be formed of a variety of conventional materials, depending on the device being packaged. In one embodiment, the material of lid 400 is sufficiently light in weight that lid 400 rests atop bead 300 after placement thereon without sinking into the still-viscous material of bead 300.

The material of lid 400 is selected in part by the desired application of package 10. For surface acoustical wave device packages, the lid is ceramic, plastic, or another suitable material. For EPROM, CCD or similar devices, the functioning of the device requires a selected or continuous application of a selected electromagnetic radiation through the package to a surface of the die. For such applications, lid 400 is comprised, in whole or part, of a material that is transparent to the particular type, frequency, and/or amount of electromagnetic radiation needed by the packaged device. In an EPROM, as one example, light is used to erase data stored in an erasable memory.

In typical EPROM or CCD applications, all or part of lid 400 would be transparent to light, such as infrared, visible, or ultraviolet light, but when light was not desired to strike the die, the lid 400 would be covered with an opaque material such as opaque tape.

In the embodiment of FIG. 1, lid 400 is a one-piece structure, formed entirely of a material transparent to such light, such as glass. In particular, a flat, one-piece plate of boro-silicate glass having a thickness of 0.02 inches is useable for lid 400. Alternatively, other optically pure materials, such as quartz, diamond, or sapphire, may also be used to form all or part of lid 400. Lid 400 may also be a lens.

In assembling package 10, as depicted in FIGS. 1 and 2A, lower surface 402 of lid 400 is placed squarely onto upper portion 302 of bead 300, centered opposite and above upper surface 201 of substrate 200 and die 100, while the epoxy or other material comprising bead 300 is still flowable and before the bead is hardened into a solid sidewall. The amount of time before bead 300 hardens, and the steps involved in hardening the bead, vary with the material selected for the bead.

In FIGS. 1 and 2A, a peripheral portion 404 of lower surface 402 of lid 400 evenly contacts upper portion 302 of bead 300 about the entire path of bead 300 around integrated circuit die 100. Example paths are shown in FIGS. 2A and 2B.

A method of placing lid 400 onto upper portion 302 of bead 300 is to use a die attach machine, such as the Alpha Sem 9006 or equivalent. Alternatively, hand placement may be used.

After the step of placing lid 400 onto bead 300, and while the material of bead 300 is still viscous, lid 400 is press fitted into bead 300. In one embodiment, this press fitting step is accomplished by mechanical pressing. A partially assembled package 10, with lid 400 atop bead 300, is placed between two parallel plates of a pressing machine. The lower plate of the pressing machine is fixed, and the upper plate moves in a direction perpendicular to the plates. Lower surface 202 of substrate 200 rests on the lower plate. The upper plate moves downward toward the lower plate and contacts upper surface 401 of lid 400. The upper plate may be, for example, approximately the size of lid 400, or a different size. The upper plate of the pressing machine presses lid 400 into dam 300 with a light downward force, for example, a 50 gram force. Because the upper and lower plates of the pressing machine are parallel, this pressing causes lid 400 to move into darn 300 while at the same time aligning upper surface 401 of lid 400 parallel to lower surface 202 of substrate 200. The downward pressing of the upper plate of the pressing machine stops at a selected distance that is equal to the desired height of the package. A sensor detects when the space between the plates reaches the targeted spacing, and stops the downward travel of the upper plate of the pressing machine. The downward travel of the upper plate, after contacting the lid, may be, for example, 0.004 inches, but that distance varies depending on the package application.

The action of the pressing machine described above is similar to the action of conventional tools used to perform trim and form steps during the manufacture of plastic quad flatpack packages or other lead frame packages. A suitable press machine may be created by modifying such a trim and form machine with parallel plates having the pressing motion described herein.

During the above-described step of press fitting lid 400 into bead 300, the still-flowable material of bead 300 moves up and contacts all or part of edge 403 of lid 400. The material chosen for bead 300 should be sufficiently viscous at this point to flow up edge 403, but sufficiently thick to support and space lid 400 a distance above upper surface 201 of substrate 200 and die 100 and/or bond wires 208 until bead 300 is completely hardened.

During the placing and press-fitting steps, upper portion 302 of bead 300, along the entire path of bead 300, contacts and adheres to a peripheral portion 404 of lower surface 402 of lid 400. This contacting and adherence is along the entire path of bead 300 about die 100. Example paths are shown in FIGS. 2A and 22. If the embodiment of FIG. 2B is used, the lid will not contact bead material in the area of the gap due to the lack of bead material.

During the press fitting step for an embodiment such as in FIG. 1, it is preferred that bead 300 contact and adhere to at least a lower portion of edge 403, beginning at the perimeter of lower surface 402 of lid 400 and extending up edge 403 in the direction of the perimeter of upper surface 401 of lid 400. Alternatively, bead 300 may contact and adhere to all of edge 403 of lid 400, up to and including the perimeter of upper surface 401 of lid 400. It is preferred that, when the material of bead 300 is hardened and the package is completed, bead 300 is in a press fitted interconnection with both peripheral portion 404 of lid 400 about the entire perimeter of lid 400 and all or part of edge 403 of lid 400. This enhances the attachment of lid 400 to bead 300.

After placement of lid 400 onto bead 300 and the press fitting of lid 300 into bead 300, the material of bead 300 is hardened to a solid. This hardening step may be performed in a variety of ways, depending on the material selected for bead 300. For example, certain epoxy materials harden with the application of heat or ultraviolet light. Upon the hardening of the material of bead 300, lid 400 is fixed in a press fitted interconnection with bead 300.

In the embodiments of FIGS. 1 and 2A, bead 300 surrounds die 100 and forms imperforate sidewalls of package 10. Bead 300 contacts, spaces, and secures lid 400 a distance above upper surface 201 of substrate 200. Preferably, bead 300 also spaces lid 400 a distance above die 100 and bond wires 208.

The spacing between substrate 200 and lid 400, or more particularly, between lower surface 402 of lid 400 and upper surface 201 of substrate 200, may be varied for particular device applications and package height requirements. This may be done, for example, by regulating the cross section size or shape of bead 300, the material of bead 300, the amount of press fitting of lid 400 into bead 300 before the step of hardening bead 300, or the amount of time before the hardening step. As an example, the final distance between lower surface 402 of lid 400 and upper surface 201 of substrate 200 may be in the range of about 0.02 to 0.04 inches, but the distance varies depending on the package application. If lid 400 is a lens, an alternative embodiment, then the spacing is more likely to be a critical dimension than in other applications.

The width of bead 300 between inner portion 303 and outer portion 304 will vary along its height, particularly if an epoxy material is used, because the initially viscous dam material will settle somewhat both inward and outward along upper surface 201 of substrate 200 after being applied to substrate 200 and before hardening. The press-fitting step will also cause dam 300 to spread.

Upon the completion of a package 10, as depicted in FIG. 1 and FIG. 2A, die 100 is fully enclosed in a closed three-dimensional cavity 11 defined by the intersections of substrate 200, bead 300, and lid 400. Substrate 200 forms the base of package 10; lid 400 opposite, centered, and spaced above substrate 200 and die 100 forms the top of package 10; and bead 300 forms the imperforate sidewalls of package 10 around die 100. Bead 300 is between and connected to substrate 200 and lid 400, and preferably is also in press-fitted interconnection with all or part of the edge of lid 400.

In certain applications, such as CCD devices, it may be desired that lid 400 be precisely parallel to upper surface 101 of die 100, and not appreciably tilted or cocked. In such applications, a process employing a bead as shown in FIG. 2B may be utilized. As the epoxy or other material comprising bead 300 is hardened, the air or other gases in cavity 11 of package 10 may expand and seek to escape. Referring to FIG. 2B, gap 305 in bead 300 provides a vent for the expanding air or gas to escape cavity 11, thus avoiding or reducing the possibility of any tilting of lid 400 which may be caused by the air or other gas in cavity 11 attempting to escape under or through bead 300 as bead 300 is hardened. Gap 305 is subsequently filled to enclose the die. Alternatively, gap 305 could serve as a port for introducing a selected inert gas or other fluid into cavity 11.

To construct the embodiment of FIG. 2B, bead 300 is applied to upper surface 201 of substrate 200 as described above, except that bead 300 is applied only partially around die 100. In FIG. 2B, bead 300 substantially surrounds die 100, except for a discontinuity, exemplified by gap 305, where the material of bead 300 is not present. An equivalent discontinuity could be formed, in an embodiment along the lines FIG. 2A, by providing a dip in upper portion 302 of bead 300. While the size and location of such discontinuities in bead 300 may be varied, bead 300 must surround enough of die 100 (e.g., a majority) to provide some support for lid 400 after lid 400 is placed onto bead 300 and before the hardening of bead 300.

After the placement and press fitting of lid 400 into bead 300, bead 300 is partially or fully hardened. Next, gap 305 (or equivalent dips or other discontinuities) of bead 300 is filled by an application of a viscous adhesive material between substrate 200 and lid 400, where bead material is lacking. If epoxy is used for bead 300, an epoxy such as Hysol 4323, which can stick to itself, is used to form bead 300. If bead 300 was only partially hardened before gap 305 was filled, any remaining gases escaping from cavity 11 of package 10 will bubble through the still-viscous material used to fill gap 305 until the entire bead is fully hardened.

This second application of adhesive material in the area of gap 305 may be performed with a dam writing machine or syringe. Alternatively, it may be done by hand. Afterwards, the additional adhesive material and/or the entire bead should be hardened into a solid, as discussed above. Upon the filling of gap 305 of bead 300 in FIG. 2B, die 100 will be fully enclosed in a closed three-dimensional cavity 11 defined by the intersections of substrate 200 (as the base), bead 300 (as the imperforate sidewall around die 100), and lid 400 (as the package top facing and above substrate 200 and die 100).

Employing the embodiment of FIG. 2B also provides a port for a selected inert gas or other substance to be introduced into package 10 prior to the final enclosure of die 100 by the filling or closing of gap 305. For example, an inert gas such as argon may be introduced into the package through the gap, so that cavity 11 would contain argon after gap 305 is closed. This step of introducing a selected gas may be done, for example, by placing the package of FIG. 2B in an argon atmosphere, allowing the argon gas to enter the cavity, and then applying a second application of bead material to the area of the gap, closing cavity 11 of package 10 and thus sealing in the argon. Of course, even with the embodiment of FIG. 2A, as discussed above, an inert gas or other selected substance may be introduced into package 10 by placing lid 400 onto bead 300 in a controlled atmosphere, such as in a hermetic chamber filled with argon gas.

The shape and orientation of edge 403 of lid 400 may be varied. For example, in FIG. 1, edge 403 of lid 400 is flat and its orientation is substantially perpendicular to the upper and lower surfaces of lid 400.

Alternatively, all or part of edge 403 of lid 400 may be provided with a lip or protrusion onto which the material of bead 300 can flow during the step of press fitting lid 400 into bead 300, to facilitate or enhance the locking and securing of lid 400 to bead 300.

FIG. 3 shows an example edge for lid 400. Edge 403 of lid 400 is shown with an upper portion 407 and a protruding sloped or diagonal lower portion 406. Upper portion 407 of edge 403 extends from the perimeter of upper surface 401 of lid 400 to a point 408 located a distance, here shown as midway, between upper surface 401 and lower surface 402 of lid 400. Upper portion 407 has a substantially perpendicular orientation with respect to upper surface 401 and lower surface 402 of lid 400, and to substrate 200. Lower portion 406 of edge 403 extends from point 408 to the perimeter of lower surface 402 of lid 400, and has a laterally outward and downward diagonal orientation with respect to upper surface 401 and lower surface 402 of lid 400, and cavity 11. The diagonal angle α of lower edge portion 406 of edge 403 is in the range of about 30 to 60 degrees, but may be varied.

With the embodiment of FIG. 3, after the placement of lid 400 onto bead 300 and during the press fitting of lid 400 into bead 300, whether by force of gravity or gravity and mechanical pressing, the still-flowable epoxy or other material comprising bead 300 will move up and cover all or part of the protrusion exemplified by diagonal lower portion 406 of edge 403. Alternatively, the material of bead 300 may cover all of lower portion 406 of edge 403 and contact all or part of upper portion 407 of edge 403. Upon hardening, the portion of the material of bead 300 in such a press-fitted interconnection with edge 403 aids the attachment between lid 400 and bead 300.

The profile, size, shape, or angle of edge 403 of lid 400 may be varied, while still accomplishing the enhanced attachment exemplified by the embodiment of FIG. 3. For example, edge 403 may alternatively have an "L" shape. As another example, instead of having an edge with an upper perpendicular portion 407 and a lower diagonal portion 406, as in FIG. 3, the entire edge 403 may be diagonal.

In the embodiment of FIG. 3, the entire perimeter of lid 400 has the edge shown in FIG. 3. For example, if lid 400 were square or rectangular, then all four sides would have the edge profile shown in FIG. 3. If lid 400 were circular, then the entire circumference would have the edge profile shown in FIG. 3. Alternatively, two sides of a square lid 400 could have the edge profile of FIG. 3, and two sides could have a perpendicular edge, as in FIG. 1.

As discussed above, lid 400 can be a flat, one-piece plate of boro-silicate glass for applications such as EPROM, CCD, or similar devices. Boro-silicate glass may be commercially purchased in sheets of various sizes, such as four inches by four inches. Depending on the desired size of the package 10, the sheet of boro-silicate glass may need to be cut to size.

In one method of assembling package 10, a flat sheet of boro-silicate glass is placed on a sheet of sticky paper, as is conventionally used when wafers are cut into individual dies. The glass sheet is then cut, using a wafer saw, to form the desired shape of lid. The boro-silicate glass sheet may be sawed in a bath of deionized water to assist in maintaining the cleanliness of the boro-silicate glass lids. After this cutting or shaping step, a conventional die attach machine is used to pick up each now-formed lid 400 from the sticky paper for placing the lid 400 onto upper portion 302 of bead 300.

Figure 4:
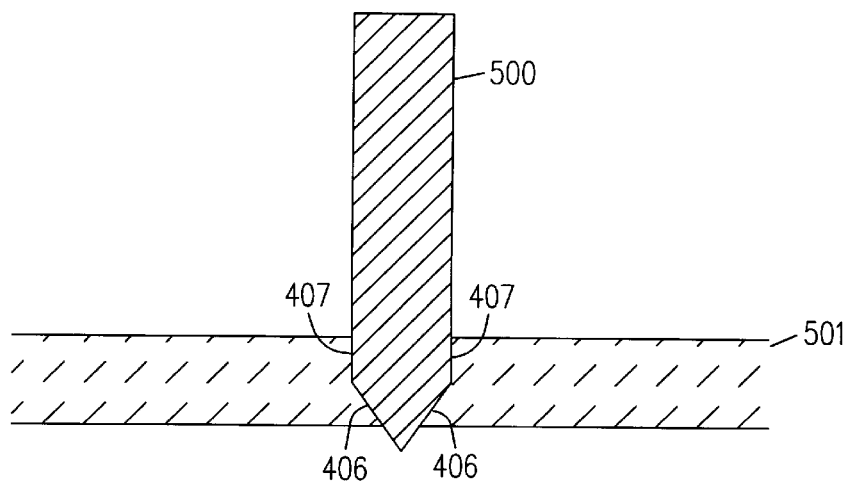
FIG. 4 shows a saw blade cutting a sheet of boro-silicate glass.

For the embodiment of FIG. 3, where lower portion 406 of edge 403 of lid 400 is provided with a diagonal laterally outward and downward protrusion, a conventional wafer saw with a tapered blade may be used to fashion edge 403. FIG. 4 shows a tapered saw blade 500 cutting a sheet 501 of the preferred boro-silicate glass. The portions of the blade that form the upper portion 407 and lower portion 406 of edge 403 of a lid 400 are shown. The lengths of upper portion 407 and lower edge 406 may be adjusted by raising or lowering the position of sheet 501 against blade 500. The diagonal angle of lower portion 406 of edge 403 may be adjusted by varying the taper of saw blade 501.

The above structures and methods may be used to create packages of varying sizes and shapes. Where a two inch by two inch square package is desired, for example, it may be most economical to construct the packages one at a time. If a smaller package is desired, for example, a 0.5 inch by 0.5 inch square package, it may be most economical to complete several packages on a single sheet of substrate material, as discussed above, and then cut the substrate sheet to separate the individual packages. In an alternative embodiment, a plurality of integrated circuit dies are placed on a single substrate base for assembly, according to the steps described above, in a single package.

The preferred and alternative embodiments described above are merely examples of the present invention. Artisans will recognize that variations are possible.

What is claimed is:

1. A package for one or more integrated circuits comprising:

a substrate having a planar first surface upon which at least one integrated circuit die is placed, an opposite second surface, and at least one conductive path extending through the substrate from the planar first surface to the second surface;

an imperforate adhesive bead on the planar first surface of the substrate, said bead surrounding the integrated circuit die;

a lid having a planar first surface facing the planar first surface of said substrate; and wherein the planar first surface of the lid is spaced above the planar first surface of the substrate and the integrated circuit die, and the planar first surface of said lid has a peripheral portion in a press fitted interconnection with said bead.

2. The package of claim 1, wherein the lid includes an edge adjacent to the peripheral portion of the first surface of the lid, and at least part of the edge is in the press fitted interconnection with said bead.

3. The package of claim 2, wherein the edge has a substantially perpendicular orientation relative to the first surface of the lid.

4. The package of claim 2, wherein at least part of the edge has a diagonal orientation relative to the first surface of the lid.

5. The package of claim 4, wherein the edge is comprised of a first portion beginning at the first surface of the lid, and a second portion adjacent to the first portion;

the first portion of the edge having a diagonal orientation relative to the first surface of the lid, and at least part of the first portion of the edge is in the press fitted interconnection with said bead; and the second portion of the edge having a substantially perpendicular orientation relative to the first surface of the lid.

6. The package of claim 2, wherein the lid is a one-piece structure.

7. The package of claim 1, wherein the first surface of the lid is spaced above the die by a maximum distance of about 0.10 mm.

8. The package of claim 2, wherein the edge of the lid includes a means for enhancing a connection between the lid and the adhesive bead, and the bead is formed of a nonconductive material.

9. The package of claim 6, wherein the lid is glass.

10. The package of claim 6, wherein the lid is plastic.

11. The package of claim 6, wherein the lid is ceramic.

12. The package of claim 6, wherein the lid is transparent to light.

13. The package of claim 6, wherein the adhesive bead is comprised of an epoxy material.

14. The package of claim 1, wherein the lid is ceramic and the integrated circuit die is a surface acoustical wave integrated circuit die.

15. The package of claim 1, wherein the lid is plastic and the integrated circuit die is a surface acoustical wave integrated circuit die.

16. The package of claim 1, wherein the integrated circuit die is a charge coupled device integrated circuit die, the lid is a one-piece structure, and the lid is transparent to light.

17. The package of claim 1, wherein the integrated circuit die is an erasable programmable read-only memory integrated circuit die, the lid is a one-piece structure, and the lid is transparent to light.

18. The package of claim 1, wherein the adhesive bead is formed of a nonconductive material.

19. The package of claim 18, wherein the adhesive bead is formed of an epoxy or silicone material.

20. The package of claim 1, further comprising a plurality of conductive pads on said integrated circuit die; and a plurality of said conductive paths extending through the substrate from the first surface to the opposite second surface;

wherein each conductive pad is electrically connected to a conductive path.

21. The package of claim 20, wherein each conductive path includes a metallized via through the substrate from the first surface to the opposite second surface;

a metal conductor on the first surface of the substrate electrically connected to said metallized via;

and a bond wire electrically connected between a conductive pad on said integrated circuit die and the metal conductor.

22. The package of claim 21, wherein the substrate is made of an insulative laminate material, ceramic, or insulated metal.

23. The package of claim 21, wherein the package is a ball grid array style package or a leadless chip carrier style package.

24. The package of claim 21, wherein the integrated circuit die is within a closed cavity bounded only by the first surface of the substrate, the adhesive bead, and the first surface of the lid.

25. The package of claim 1, wherein the integrated circuit die is within a closed cavity bounded only by the first surface of the substrate, the adhesive bead, and the first surface of the lid.

26. The package of claim 1, wherein the first surface of the substrate and the first surface of the lid are flat.

27. The package of claim 26, wherein the adhesive bead is formed of a nonconductive material.

28. The package claim 27, wherein the adhesive bead is formed of an epoxy or silicone material.

29. The package of claim 26, further comprising a plurality of conductive pads on said integrated circuit die; and a plurality of said conductive paths extending through the substrate from the first surface to the opposite second surface;

wherein each conductive pad is electrically connected to a conductive path.

30. The package of claim 29, wherein each conductive path includes a metallized via through the substrate from the first surface to the opposite second surface;

a metal conductor on the first surface of the substrate electrically connected to said metallized via;

and a bond wire electrically connected between a conductive pad on said integrated circuit die and the metal conductor.

31. The package of claim 27, wherein the integrated circuit die is within a closed cavity bounded only by the first surface of the substrate, the adhesive bead, and the first surface of the lid.

32. The package of claim 27, wherein the lid is a one-piece structure and is transparent to light.

33. The package of claim 27, wherein the lid is a one-piece structure made of glass or plastic.

34. The package of claim 26, wherein the lid is a one-piece structure made of ceramic.

35. The package of claim 25, wherein the lid is a one-piece structure made of glass or plastic.

36. The package of claim 31, wherein the lid is a one-piece structure made of glass or plastic.

37. A package for one or more integrated circuits comprising:

a substrate having a planar first surface upon which at least one integrated circuit die is placed, an opposite second surface, and at least one conductive path extending through the substrate from the planar first surface to the second surface;

an adhesive bead on the planar first surface of the substrate, the bead surrounding the integrated circuit die;

a lid having a planar first surface facing the planar first surface of the substrate; and wherein the planar first surface of the lid is spaced above the planar first surface of the substrate and the integrated circuit die by the bead, and the planar first surface of the lid has a peripheral portion in a press fitted interconnection with the bead.

38. The package of claim 37, wherein the lid is ceramic.

39. The package of claim 38, wherein the integrated circuit die is a surface acoustical wave integrated circuit die.

40. The package of claim 37, wherein the lid is plastic.

41. The package of claim 40, wherein the integrated circuit die is a surface acoustical wave integrated circuit die.

42. The package of claim 37, wherein the lid is a one-piece structure and is transparent to light and the bead is imperforate.

43. The package of claim 42, wherein the integrated circuit die is a charge coupled device integrated circuit die.

44. The package of claim 42, wherein the integrated circuit die is an erasable programmable read-only memory integrated circuit die.

45. The package of claim 37, wherein the adhesive bead is imperforate.

46. A package for an integrated circuit die comprising:

a substrate having a planar first surface upon which an integrated circuit device is placed and a conductive path extending through the substrate, wherein the integrated circuit die is electrically connected to the conductive path;

an adhesive bead on the planar first surface of the substrate, the bead surrounding the integrated circuit die;

a lid having a planar first surface facing the first surface of the substrate; and wherein the planar first surface of the lid is spaced above the planar first surface of the substrate and the integrated circuit die by the bead, and the planar first surface of the lid has a peripheral portion connected to the bead around the die.

47. The package of claim 46, wherein the lid is a one-piece structure.

48. The package of claim 47, wherein the lid is transparent to light.

49. The package of claim 47, wherein the lid is plastic.

50. The package of claim 47, wherein the lid is ceramic.

51. The package of claim 46 wherein the substrate includes a second surface opposite said planar first surface; and a plurality of conductive paths extend through said substrate from said planar first surface to said opposite second surface.

52. The package of claim 51, wherein the lid is a one-piece structure and is transparent to light.

53. The package of claim 52, wherein the substrate is made of an insulative laminate material, ceramic, or insulated metal.

54. The package of claim 51, wherein the lid is a one-piece structure made of glass or plastic.

55. The package of claim 54, wherein the substrate is made of an insulative laminate material, ceramic, or insulated metal.

56. The package of claim 51, wherein the adhesive bead is formed of a nonconductive material and is imperforate; and the integrated circuit die is within a closed cavity bounded only by the first surface of the substrate, the adhesive bead, and the first surface of the lid.

57. The package of claim 56, wherein the lid is a one-piece structure made of glass or plastic.

58. The package of claim 51, wherein the substrate is made of an insulative laminate material, ceramic, or insulated metal.

59. The package of claim 51, wherein the package is a ball grid array style package or a leadless chip carrier style package.

60. The package of claim 46, wherein the adhesive bead is formed of a nonconductive material and is imperforate.

61. The package of claim 60, wherein the lid is a one-piece structure and is transparent to light.

62. The package of claim 60, wherein the lid is a one-piece structure made of glass or plastic.

63. The package of claim 60, further comprising a plurality of conductive pads on said integrated circuit die; and a plurality of said conductive paths extending through the substrate from the first surface to the opposite second surface;

wherein each conductive pad is electrically connected to a conductive path.

64. The package of claim 63, wherein each conductive path includes a metallized via through the substrate from the first surface to the opposite second surface;

a metal conductor on the first surface of the substrate electrically connected to said metallized via;

and a bond wire electrically connected between a conductive pad on said integrated circuit die and the metal conductor.

65. The package of claim 60, wherein the lid is in a press-fitted interconnection with the adhesive bead, and the lid is a one-piece structure made of glass or plastic.

66. The package of claim 46, wherein the substrate is made of an insulative laminate material, ceramic, or insulated metal.

67. The package of claim 46, wherein the adhesive bead is formed of a nonconductive material and is imperforate.

68. The package of claim 67 wherein the substrate includes a second surface opposite said substantially planar first surface; and a plurality of conductive paths extend through said substrate from said first surface to said opposite second surface.

69. The package of claim 68, wherein the lid is a one-piece structure and is transparent to light.

70. The package of claim 68, wherein the lid is a one-piece structure made of glass or plastic.

71. The package of claim 68, wherein the lid is a one-piece structure made of ceramic.

72. The package of claim 68, further comprising a plurality of conductive pads on said integrated circuit die; and a plurality of said conductive paths extending through the substrate from the first surface to the opposite second surface;

wherein each conductive pad is electrically connected to a conductive path.

73. The package of claim 68, wherein the integrated circuit die is within a closed cavity bounded only by the first surface of the substrate, the adhesive bead, and the first surface of the lid; and the lid is a one-piece structure made of glass or plastic.

74. The package of claim 72, wherein each conductive path includes a metallized via through the substrate from the first surface to the opposite second surface;

a metal conductor on the first surface of the substrate electrically connected to said metallized via;

and a bond wire electrically connected between a conductive pad on said integrated circuit die and the metal conductor.

75. The package of claim 74, wherein the integrated circuit die is within a closed cavity bounded only by the first surface of the substrate, the adhesive bead, and the first surface of the lid; and the lid is a one-piece structure made of glass or plastic.

* * * * *